(12) United States Patent
Cheng et al.

(10) Patent No.: US 8,053,809 B2
(45) Date of Patent: Nov. 8, 2011

(54) DEVICE INCLUDING HIGH-K METAL GATE FINFET AND RESISTIVE STRUCTURE AND METHOD OF FORMING THEREOF

(75) Inventors: Kangguo Cheng, Albany, NY (US); Bruce B. Doris, Yorktown Heights, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 12/471,872

(22) Filed: May 26, 2009

(65) Prior Publication Data
US 2010/0301417 A1   Dec. 2, 2010

(51) Int. Cl.
*H01L 29/66* (2006.01)
(52) U.S. Cl. . 257/173; 257/529; 257/665; 257/E21.592; 438/132; 438/281
(58) Field of Classification Search .......... None
See application file for complete search history.

(56) References Cited

U.S. PATENT DOCUMENTS

| | | | |
|---|---|---|---|
| 5,057,672 A | 10/1991 | Bohlender et al. | |
| 6,382,307 B1 | 5/2002 | Wang et al. | |
| 6,580,137 B2 | 6/2003 | Parke | |
| 6,787,424 B1 * | 9/2004 | Yu | 438/300 |
| 7,071,052 B2 | 7/2006 | Yeo et al. | |
| 7,112,495 B2 | 9/2006 | Ko et al. | |
| 2005/0040493 A1 * | 2/2005 | Yeo et al. | 257/536 |
| 2008/0157201 A1 * | 7/2008 | Marshall | 257/350 |
| 2010/0244144 A1 * | 9/2010 | Hsueh et al. | 257/379 |

* cited by examiner

*Primary Examiner* — Evan Pert
*Assistant Examiner* — Scott R Wilson
(74) *Attorney, Agent, or Firm* — Scully, Scott, Murphy & Presser, P.C.; Joseph P. Abate, Esq.

(57) ABSTRACT

A device is provided that in one embodiment includes a substrate having a first region and a second region, in which a semiconductor device is present on a dielectric layer in the first region of the substrate and a resistive structure is present on the dielectric layer in the second region of the substrate. The semiconductor device may include a semiconductor body and a gate structure, in which the gate structure includes a gate dielectric material present on the semiconducting body and a metal gate material present on the gate dielectric material. The resistive structure may include semiconductor material having a lower surface is in direct contact with the dielectric layer in the second region of the substrate. The resistive structure may be a semiconductor containing fuse or a polysilicon resistor. A method of forming the aforementioned device is also provided.

21 Claims, 7 Drawing Sheets

DEVICE INCLUDING HIGH-K METAL GATE FINFET AND RESISTIVE STRUCTURE AND METHOD OF FORMING THEREOF

FIELD OF INVENTION

The present invention relates to micro-electronic devices. In one embodiment, the present invention provides a semiconductor device in combination with a semiconductor containing fuse or semiconductor containing resistor.

BACKGROUND OF THE INVENTION

Current semiconductors and other similar devices are often manufactured with a large number of fuse elements which are used to invoke the replacement of failing cells or components, and provide direct alternative current (DAC) trimming, etc. During testing of the device, selected fuses are usually blown by either a laser beam or an electrical current, depending on the design of the fuse/device. In an electrical fuse design, electronically programmable fuses are blown by passing a current through the fuse link. The electrical current then causes a permanent change to the resistance of the fuse. The fuses that are blown are selected by one or more programming methods, which are generally known to those skilled in the art.

Electrically programmable fuses, also called eFuses, have become popular recently, because of the circuit and systems design flexibility that it provides. The eFuse can be programmed even when the chip is mounted in the package and installed in the system. For example, customers can tailor a design to the specific needs of the application after the product is installed in the field. The eFuse also enables the freedom to alter the design, or fix problems that may occur during the life of the product.

SUMMARY OF THE INVENTION

A device is provided that in one embodiment includes a substrate having a first region including a semiconductor device, and a second region including a semiconductor containing fuse. Typically, a dielectric layer is present on the substrate. The semiconductor device that is present on the dielectric layer in the first region of the substrate may include a semiconducting body and a gate structure. The gate structure typically includes a gate dielectric material present on the semiconducting body and a gate conductor material present on the gate dielectric material. The semiconductor containing fuse may include a layered structure having a conductive material atop a semiconductor material. The semiconductor containing fuse may further include an anode, a cathode, and a fuselink connecting the anode to the cathode. In one embodiment, the semiconductor material of the semiconductor containing fuse is in direct contact with the dielectric layer in the second region of the substrate.

In another embodiment, the gate dielectric material of the semiconductor device in the first region extends into the second region of the substrate in which the semiconductor containing fuse is present. In this embodiment, the gate dielectric material of the semiconductor device is present between, and in direct contact with, the semiconductor layer of the semiconductor containing fuse and the dielectric layer that is present on the substrate.

In another embodiment, a device is provided that includes a substrate having a first region including a semiconductor device and a second region including a resistive structure. Typically, the substrate includes a dielectric layer present thereon. The semiconductor device present on the dielectric layer in the first region of the substrate may include a semiconductor body and a gate structure. The gate structure typically includes a gate dielectric material present on the semiconducting body and a gate conductor material present on the gate dielectric material. The resistive structure may include a semiconductor material, in which a first terminal and a second terminal is present on an upper surface of the semiconductor material. In one embodiment, a lower surface of the semiconductor material of the resistive structure is in direct contact with the dielectric layer that is present in the second region of the substrate.

In another embodiment, the gate dielectric material of the semiconductor device in the first region extends into a second region of the substrate in which a resistive structure is present. In this embodiment, the lower surface of the semiconductor material of the resistive structure is in direct contact with the gate dielectric material of the semiconductor device, wherein the gate dielectric material is present between, and in direct contact with, the semiconductor material of the resistive structure and the dielectric layer that is present on the substrate.

In another aspect of the invention, a method of forming a device is provided in which a semiconductor device is present in one region of a substrate, and a resistive structure is present in a second region of the substrate. Broadly, the method begins with providing a substrate having a first region and second region, wherein the substrate comprises a dielectric upper surface. In a following process sequence, a semiconductor body for the semiconductor devices is formed on the dielectric upper surface overlying the first region of the substrate. Thereafter, a gate stack is formed on the semiconductor body, and overlying the dielectric surface in the first region and the second region of the substrate. The gate stack may include a gate dielectric material in contact with at least the semiconductor body, and a gate conductor material that is present on the gate dielectric material. Thereafter, at least the gate conductor material is removed from the gate stack in the second region of the substrate. A semiconductor containing contact is then formed in electrical communication with the gate metal material, and a semiconductor component of the resistive structure is formed overlying the dielectric surface of the second region of the substrate. The semiconductor containing contact of the semiconductor device may be separated from the semiconductor component of the resistive structure. Source and drain regions for the semiconductor device are then formed in the semiconductor body. Thereafter, conductive structures are formed to at least the semiconductor component of the resistive structure.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1 is a side cross-sectional view depicting one embodiment of providing a substrate having a first region and a second region, and forming a semiconductor body in the first region of the substrate, in accordance with the present invention.

FIG. 2 is a side cross-sectional view depicting forming a gate stack on the semiconductor body and overlying the dielectric upper surface, i.e., dielectric layer, in the first region and the second region of the substrate, wherein the gate stack includes a gate dielectric material that is in contact with at least the semiconductor body, and a gate conductor material on the gate dielectric material, in accordance with one embodiment of the present invention.

Figure 4A:
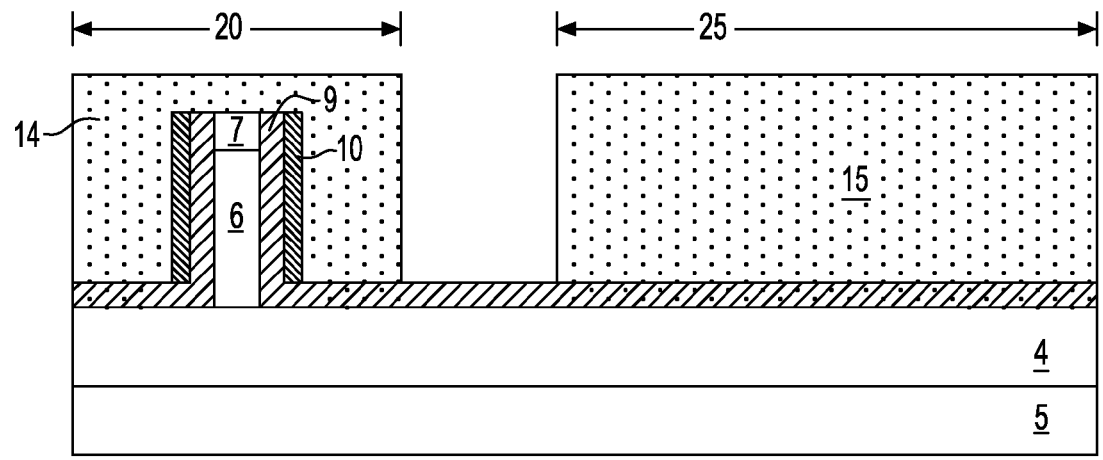

FIG. 4A is a side cross-sectional view depicting forming a semiconductor containing contact in electrical communication with the gate conductor material of the semiconductor device in the first region of the substrate, and forming a semiconductor component of a resistive structure in direct contact with the gate dielectric material that is present in the second region of the substrate, in accordance with one embodiment of the invention.

Figure 4B:
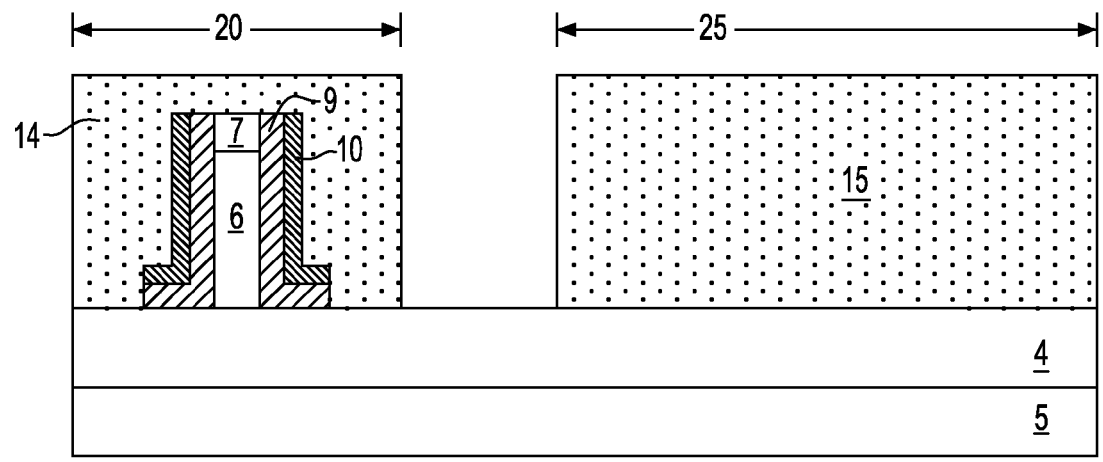

FIG. 4B is a side cross-sectional view of forming a semiconductor containing contact in electrical communication with the gate conductor material of the semiconductor devices in the first region of the substrate, and forming a semiconductor component of a resistive structure in direct contact with the dielectric surface, i.e., dielectric layer, in the second region of the substrate, in accordance with another embodiment of the invention.

Figure 5A:
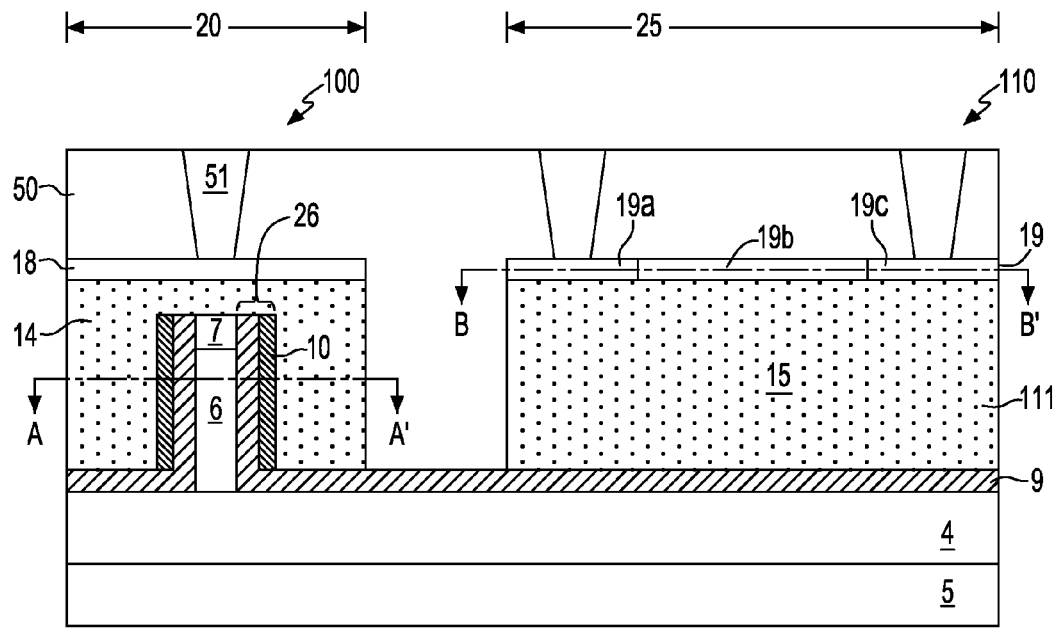

FIG. 5A depicts a side cross-sectional view of one embodiment of a device that may be formed from the structure depicted in FIG. 4A, in which a semiconductor device is present in the first device region of the substrate and a semiconductor containing fuse is present in the second region of the substrate, in accordance with the present invention.

Figure 5B:
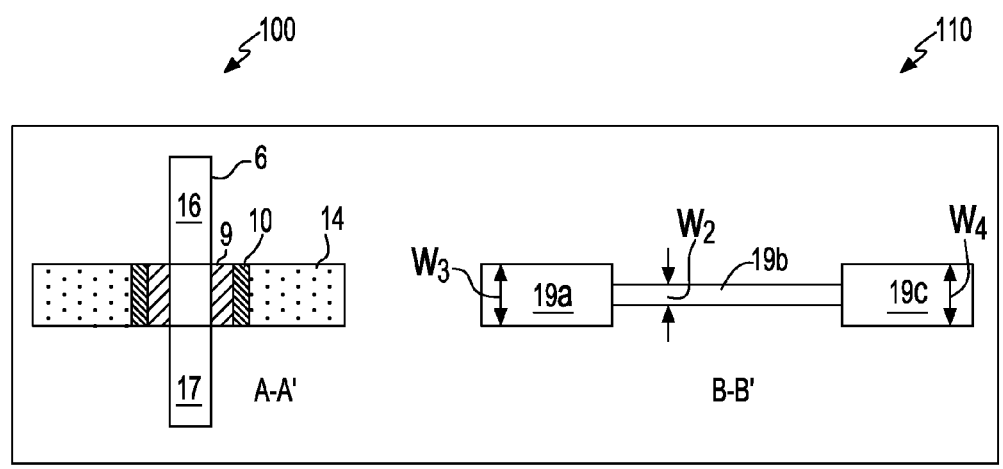

FIG. 5B depicts a top planar view of the structure depicted in FIG. 5A across section line A-A and across section line B-B.

Figure 5C:
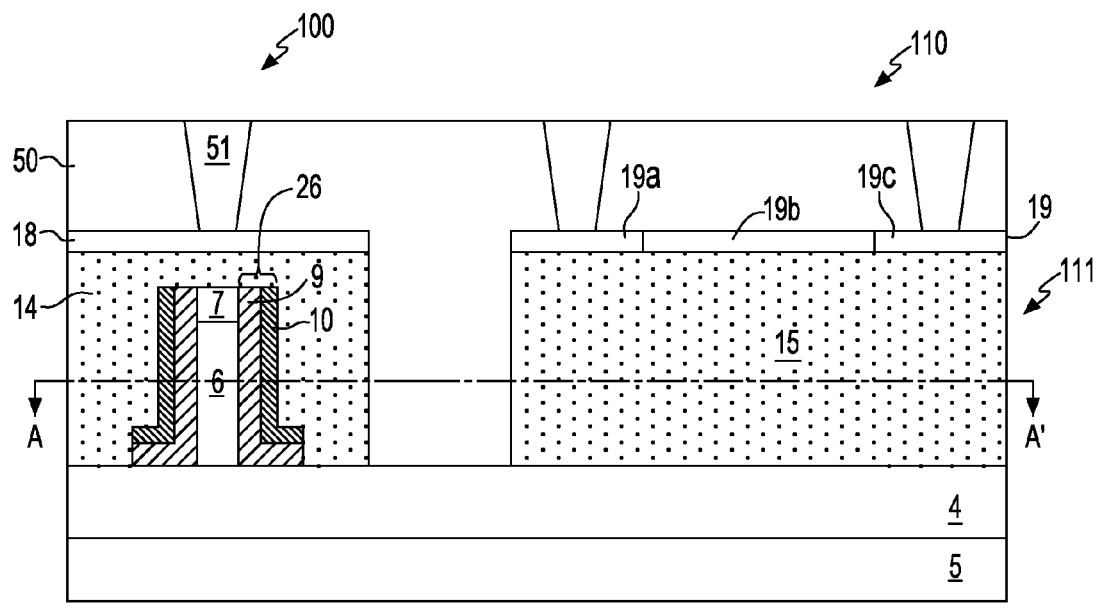

FIG. 5C depicts a side cross-sectional view of one embodiment of a device that may be formed from the structure depicted in FIG. 4B, in which a semiconductor device is present in the first region of the substrate and a semiconductor containing fuse is present in the second region of the substrate, in accordance with the present invention.

Figure 5D:
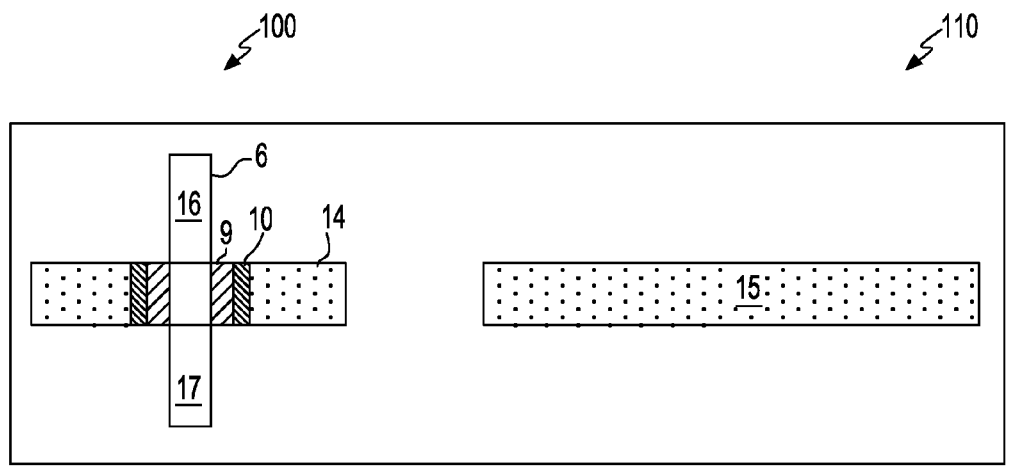

FIG. 5D depicts a top planar view of the structure depicted in FIG. 5C across section line A-A.

Figure 5E:
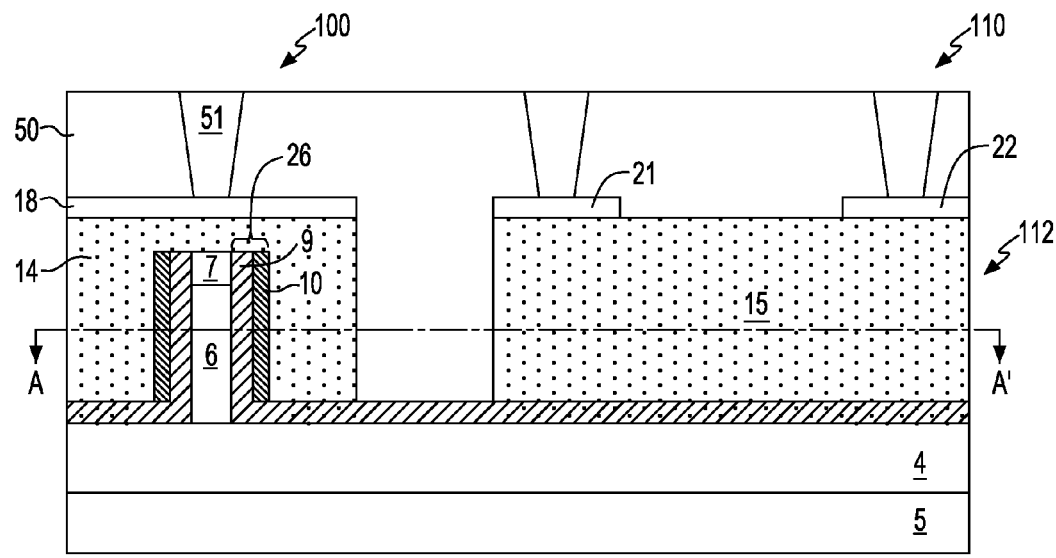

FIG. 5E depicts a side cross-sectional view of one embodiment of a device that may be formed from the structure depicted in FIG. 4A, in which a semiconductor device is present in the first region of the substrate and a semiconductor containing resistor, e.g., polysilicon resistor, is present in the second region of the substrate, in accordance with the present invention.

Figure 5F:
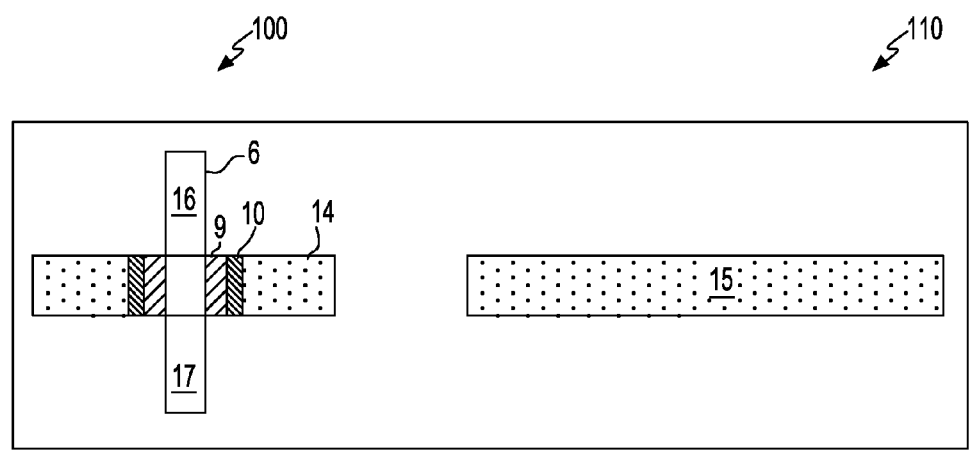

FIG. 5F depicts a top planar view of the structure depicted in FIG. 5E across section line A-A.

Figure 5G:
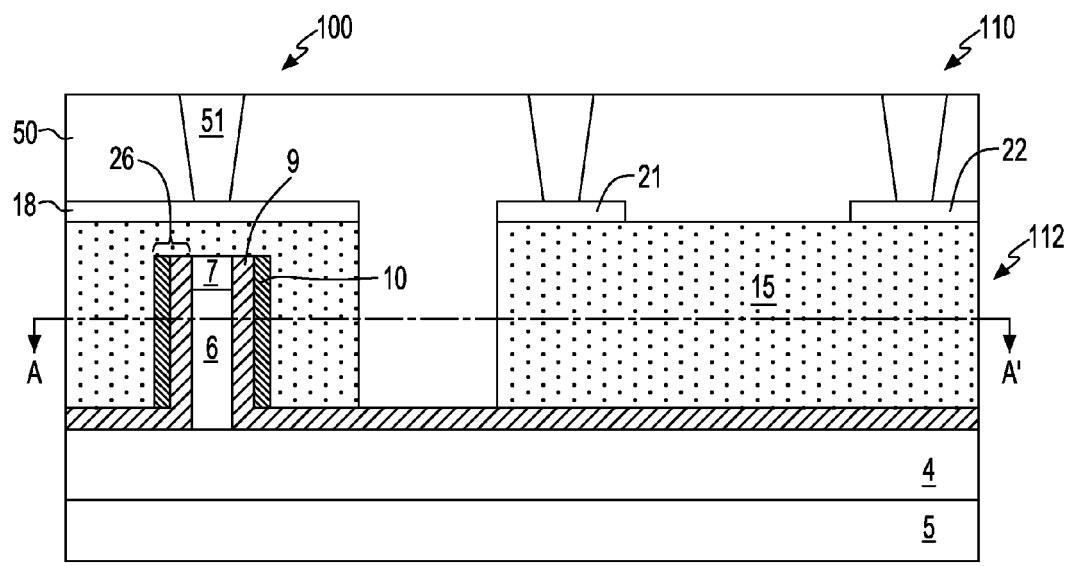

FIG. 5G depicts a side cross-sectional view of one embodiment of a device that may be formed from the structure depicted in FIG. 4B, in which a semiconductor device is present in the first region of the substrate and a semiconductor containing resistor, e.g., polysilicon resistor, is present in the second region of the substrate, in accordance with the present invention.

Figure 5H:
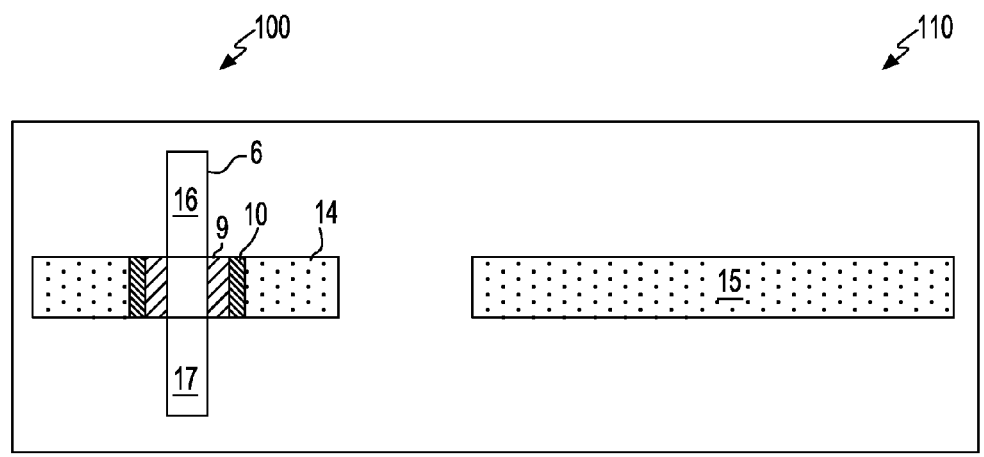

FIG. 5H depicts a top planar view of the structure depicted in FIG. 5G across section line A-A.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention relates to structures and methods for forming a semiconductor device, such as a finFET semiconductor device, and a resistive structure, such as a semiconductor containing fuse, e.g., eFuse, or a semiconductor containing resistor, e.g., polysilicon resistor, on the same substrate, in which at least the gate conductor material of the semiconductor device is not present between the resistive structure and the portion of the substrate on which the resistive structure is positioned. In one embodiment, by ensuring that the gate conductor material of the semiconductor device is not present underlying the semiconductor component of the resistive structure, the present invention reduces the likelihood that the gate conductor material provides a low resistance electrical pathway that can narrow the programming margin of the resistive component.

When describing the following structures and methods, the following terms have the following meanings, unless otherwise indicated.

As used herein, "semiconductor device" refers to an intrinsic semiconductor material that has been doped, that is, into which a dopant has been introduced, giving it different electrical properties than the intrinsic semiconductor, in which the switching state from "on" to "off" of the semiconductor device is controlled by a gate structure. Doping involves adding dopant atoms to an intrinsic semiconductor, which changes the electron and hole carrier concentration of the intrinsic semiconductor at thermal equilibrium. Dominant carrier concentrations in an extrinsic semiconductor classify it as either an n-type or p-type semiconductor.

As used herein, a "semiconductor body" refers to a semiconductor material, which is employed as the body of a field effect transistor. The body including at least the channel of the device.

A "finFET" is a semiconductor device in which at the gate dielectric material and gate are positioned around the semiconducting body such that charge flows down the channel on at least the sidewalls of the semiconducting body.

A "gate structure" means a structure used to control output current (i.e., flow of carriers in the channel, e.g., turn "on" or "off") of a semiconductor device through electrical or magnetic fields.

As used herein, "p-type" refers to the addition of impurities to an intrinsic semiconductor that create deficiencies of valence electrons.

As used herein, "n-type" refers to the addition of impurities that contribute free electrons to an intrinsic semiconductor.

As used herein, the terms "dielectric", "insulating" or "insulating properties" denotes a material having a room temperature conductivity of less than $10^{-10}$ $(\Omega\text{-m})^{-1}$.

A "resistive structure" is a semiconductor resistor or a semiconductor containing fuse.

A "semiconductor containing resistor" is a device having a resistor body composed of a semiconductor material, i.e., semiconductor component, in which the resistive body has a resistivity greater than 0.0001 ohm-cm, and terminals at opposing ends of the semiconductor material.

A "semiconductor containing fuse" is a structure that can be blown by passing a current through a fuse link. The electrical current causes a permanent change to the resistance of the semiconductor containing fuse. The resistance of the semiconductor containing fuse becomes greater after being blown when compared to its original resistance. Depending on the dimensions and materials of the semiconductor containing fuse, the minimum current that is required to blow the semiconductor containing fuse may range from about one micron amp to on the order of ten of milliamps.

An "eFuse" is a semiconductor containing fuse including a semiconductor component having a conductive material present thereon, the conductive material including an anode and a cathode being connected by a fuselink, in which the eFuse is blown through electromigration of the conductive material of the fuselink providing an open condition between the anode and the cathode.

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element as a layer, region or substrate is referred to as being "on" or "atop" or "over" or "overlying" or "below" or "beneath" or "underlying" another element, it can be directly on the other element or intervening elements may also be present. In contrast, when an element is referred to as being "directly on" or "directly over" or in "direct physical contact" with another element, there are no intervening elements present.

References in the specification to "one embodiment", "an embodiment", "an example", etc., indicate that the embodiment or example described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments and examples whether or not explicitly described.

Figure 1:
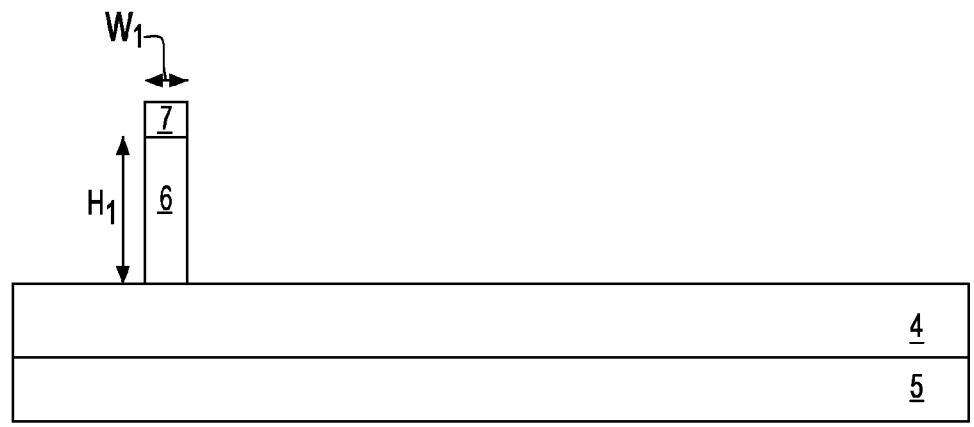

FIG. 1 depicts an initial structure used in one embodiment of the present invention. The initial structure may include a substrate 5, a dielectric layer 4 present atop the substrate 5, and a semiconductor body 6 present on a first portion of the substrate 5. The dielectric layer provides a dielectric surface that is overlying the substrate 5.

In one embodiment, the initial structure may be formed from a semiconductor on insulator (SOI) substrate. An SOI substrate includes a bottom semiconductor layer and a top semiconductor layer (which is interchangeably referred to as an SOI layer) that are electrically isolated from each other by a buried insulating layer. In this example, the SOI substrate may be patterned and etched to provide the initial structure provided in FIG. 1, in which the SOI layer provides the semiconductor body 6, the buried insulating layer provides the dielectric layer 4, and the bottom semiconductor layer provides the substrate 5.

The SOI layer and the bottom semiconductor layer may comprise at least one of Si, Ge, SiGe, GaAs, InAs, InP, SiCGe, SiC as well as other III/V or II/VI compound semiconductors and alloys thereof. The SOI layer and bottom semiconductor layer may comprise the same or different materials. In one example, the SOI layer may be amorphous, polycrystalline, or monocrystalline. In one example, the bottom semiconductor layer may be amorphous, polycrystalline, or monocrystalline. The buried insulating material separating the SOI layer and the bottom semiconductor layer may be a crystalline or non-crystalline oxide, nitride, oxynitride, or any other suitable insulating material. The buried insulating layer may comprise a single layer of dielectric material or multiple layers of dielectric materials. The buried insulating layer may have a thickness ranging from 1 nm to 100 nm.

A photolithography and etch process sequence may be utilized to provide the initial structure depicted in FIG. 1 from an SOI substrate. Specifically, in one example, a photoresist mask is formed overlying the SOI layer of the SOI substrate in which the portion of the SOI layer that is underlying the photoresist mask provides the semiconductor body 6, and the portion of the SOI layer that is not protected by the photoresist mask is removed using a selective etch process. To provide the photoresist mask, a photoresist layer is first positioned atop the SOI layer. The photoresist layer may be provided by a blanket layer of photoresist material that is formed utilizing a deposition process such as, for example, CVD, PECVD, evaporation or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected portions of the SOI layer selective to the underlying buried insulating layer. For example, the transferring of the pattern provided by the photoresist into the SOI layer may include an anisotropic etch. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In another embodiment, a hard mask dielectric layer may be deposited over the SOI layer prior to the formation of the photoresist mask. The hard mask dielectric layer may be composed of a nitride or oxide. The hard mask dielectric layer and a two stage anisotropic etch may be utilized to transfer the pattern from the photoresist mask into the SOI layer to provide the semiconductor body 6. More specifically, following the formation of the photoresist mask, the two stage anisotropic etch may be conducted, in which a first selective etch removes the exposed portions of the hard mask dielectric layer, wherein the photoresist mask protects the portion of the hard mask dielectric layer that is present beneath the photoresist mask to provide a dielectric cap 7. The SOI layer that is beneath the protected remaining portions of the hard mask dielectric layer provides the semiconductor body 6 of the subsequently formed device.

The first stage of the anisotropic etch may continue until the portion of the hard mask dielectric layer exposed by the photoresist mask is removed to expose the SOI layer. In a second stage of the two stage anisotropic etch, the exposed portions of the SOI layer are removed by an etch chemistry that removes the material of the SOI layer selective to the buried insulating layer. During the second stage of the etch process, the remaining portion of the hard mask dielectric layer functions as an etch mask that protects the underlying portion of the SOI layer to provide the semiconductor body 6 from the SOI layer. During the second stage of the anisotropic etching, the exposed portion of the SOI layer is removed. The remaining portion of the hard mask dielectric layer may then be removed, or remain atop the semiconductor body 6 as dielectric cap 7. Alternatively, the semiconductor body 6 can be formed by other techniques, such as spacer imaging transfer.

The semiconductor body 6 may have a height $H_1$ ranging from 5 nm to 200 nm. In one embodiment, the semiconductor body 6 has a height $H_1$ ranging from 10 nm to 100 nm. In another embodiment, the semiconductor body 6 has a height $H_1$ ranging from 20 nm to 50 nm. The semiconductor body 6 may have a width $W_1$ of sub-lithographic dimension. In one embodiment, the fin structure 10 has a width $W_1$ ranging from 5 nm to 200 nm. In another embodiment, the semiconductor body 6 has a width $W_1$ ranging from 15 nm to 30 nm.

It is noted that although the initial structure depicted in FIG. 1 is described as being formed from an SOI substrate, embodiments of the present invention are contemplated that utilize a bulk semiconductor substrate. In one example of the present invention, in which a bulk semiconductor substrate is used, the bulk semiconductor substrate comprises at least one of Si, Ge, SiGe, GaAs, InAs, InP, SiCGe, SiC as well as other III/V or II/VI compound semiconductors and alloys thereof. In this example, a dielectric layer is deposited atop the bulk substrate followed by the deposition of a semiconductor-containing layer. Thereafter, the semiconductor body 6 is formed from the deposited semiconductor-containing layer using photolithography and etching.

Figure 2:
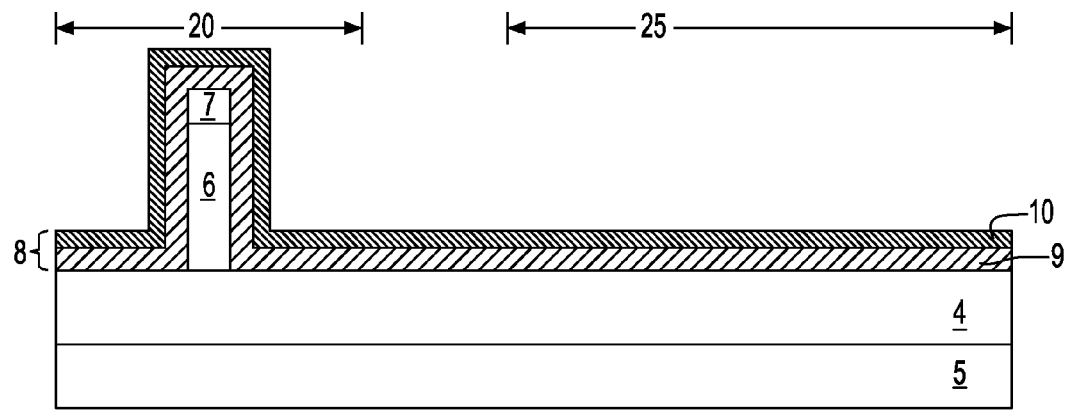

FIG. 2 depicts forming a gate stack 8 on the semiconductor body 6 and overlying the portion of the dielectric layer 4 that is not covered by the semiconductor body 6 in the first region 20 and the second region 25 of the substrate 5. The first region 20 of the substrate 5 is the portion of the substrate 5 in which the semiconductor device is subsequently formed, and the second region 25 of the substrate 5 is the portion of the substrate 5 in which the resistive structure, i.e., semiconductor containing resistor or semiconductor containing fuse, is subsequently formed.

In one embodiment, the gate stack 8 includes a gate dielectric material 9 in contact with at least the semiconductor body 6, and a gate conductor material 10 on the gate dielectric material 9. The gate dielectric material 9 (also referred to as a gate dielectric) is typically positioned on at least the vertical sidewalls of the semiconductor body 6. The gate dielectric material 9 may be formed by a thermal growth process such as, for example, oxidation, nitridation or oxynitridation. The gate dielectric material 9 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one embodiment, the gate dielectric material 9 is deposited using a conformal deposition process. The term "conformal" denotes a layer having a thickness that does not deviate from greater than or less than 20% of an average value for the thickness of the layer. The gate dielectric material 9 may also be formed utilizing any combination of the above processes.

The gate dielectric material 9 may be comprised of an insulating material having a dielectric constant of 4.0 or greater. In another embodiment, the gate dielectric material 9 is comprised of an insulating material having a dielectric constant greater than 7.0. The dielectric constants mentioned herein are relative to a vacuum. In one embodiment, the gate dielectric material 9 employed in the present invention includes, but is not limited to: an oxide, nitride, oxynitride and/or silicates including metal silicates, aluminates, titanates and nitrides. In one example, when the gate dielectric material 9 is comprised of an oxide, the oxide may be selected from the group including, but not limited to: $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric material 9 may vary, but typically, the gate dielectric material 9 has a thickness ranging from 1 nm to 10 nm. In another embodiment, the gate dielectric material 9 has a thickness ranging from 1 nm to 3 nm.

After forming the gate dielectric material 9, a blanket layer of a gate conductor material 10 which provides the gate conductor of the gate structure to the semiconductor body 6 is formed on the gate dielectric material 9 utilizing a deposition process, such as physical vapor deposition (PVD), CVD or evaporation. In one embodiment, the gate conductor material 10 is deposited using a conformal deposition process. The gate conductor material 10 may be composed of polysilicon, SiGe, a silicide, a metal or a metal-silicon-nitride, such as Ta—Si—N. Examples of metals that can be used as the gate conductor material 10 include, but are not limited to: Al, W, Cu, Ti or other like conductive metals. In one embodiment, the gate conductor material 10 comprises Ti, Zr, Hf, V, Nb, Ta, TiN, TaN or a combination thereof. The blanket layer of the gate conductor material 10 may be doped or undoped. If doped, an in-situ doping deposition process may be employed. Alternatively, a doped conductive material can be formed by deposition, ion implantation and annealing. The physical thickness of the gate conductor material 10 may vary, but typically, the gate conductor material 10 has a thickness ranging from 1 nm to 10 nm. In another embodiment, the gate conductor material 10 has a thickness ranging from 1 nm to 3 nm.

Figure 3A:
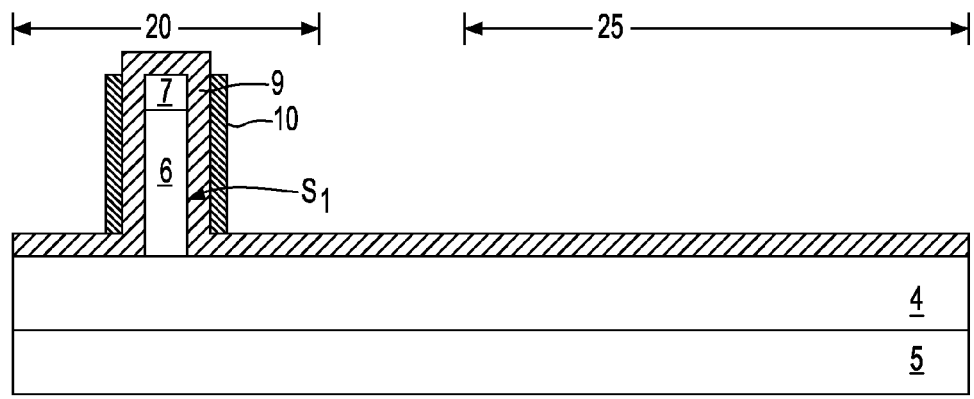
FIG. 3A is a side cross-sectional view depicting removing the gate conductor material from the gate stack in the second region of the substrate, in accordance with one embodiment of the present invention.
Figure 3B:
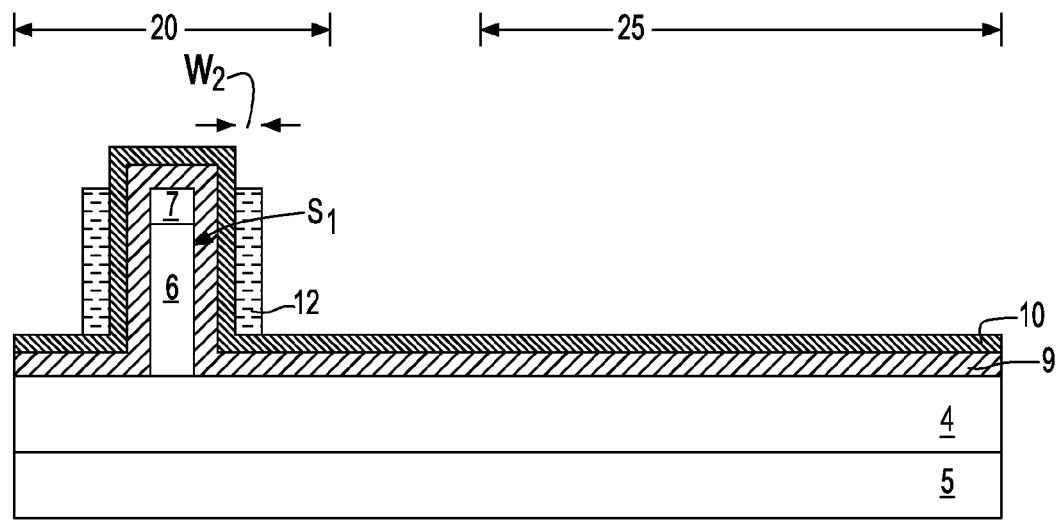
FIG. 3B is a side cross-sectional view of forming a spacer abutting the portion of the gate conductor material that is abutting the sidewall of the semiconductor body, in accordance with another embodiment of the present invention.
Figure 3C:
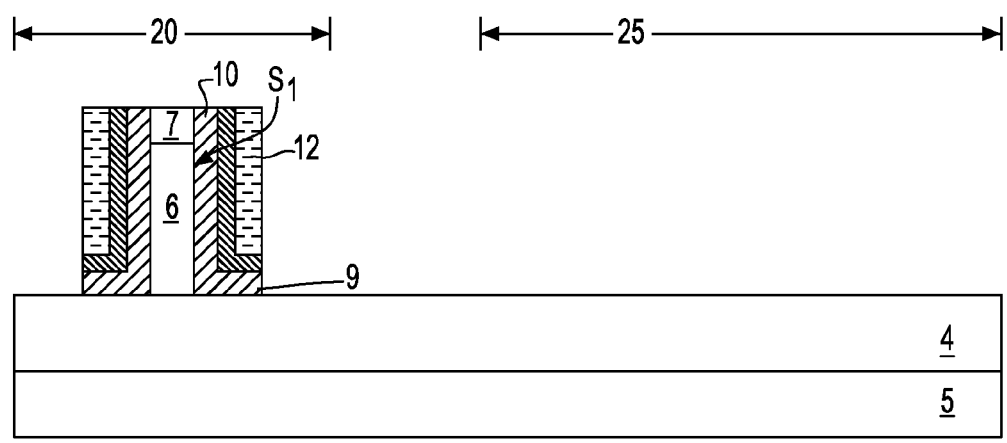
FIG. 3C is a side cross-sectional view of removing the gate conductor material and the gate dielectric material from the gate stack in the second region of the substrate from the structure depicted in FIG. 3B.

FIGS. 3A-3C depict removing at least the gate conductor material 10 from the gate stack second region 25 of the substrate 5. Referring to FIG. 3A, in one embodiment, the gate conductor material 10 is removed from the second region 25 of the substrate 5 to expose the gate dielectric material 9 on which the resistive structure is subsequently formed. In the embodiments of the invention consistent with the structure depicted in FIG. 3A, the semiconductor component of the subsequently formed resistive structure is present in direct contact with the gate dielectric material 9 that is present in the second region 25 of the device.

The gate conductor material 10 may removed from the horizontal surfaces of gate dielectric material 9 that is overlying the substrate 5, and the horizontal surfaces of the semiconductor body 6, i.e., top surface of the semiconductor body 6. In one example, the gate conductor material 10 is removed using a timed anisotropic etching process, such as reactive ion etching. A timed anisotropic etch process can remove the gate conductor material 10 leaving a remaining gate conductor portion on the sidewall $S_1$ on the semiconductor body 6, because the vertical thickness of the gate conductor material 10 that is abutting the sidewall $S_1$ of the semiconductor body 6 is greater than the vertical thickness of the gate conductor material 10 that is located overlying the upper surface of the semiconductor body 6 and the remaining portion of the gate conductor material 10 that is overlying the substrate 5. By "vertical thickness" it is meant the thickness of the gate conductor material 10 as measured from the upper surface of the substrate 5. In one embodiment, the etching process may utilize end point detection methods in order to determine when the etch process should be terminated. The portion of the gate dielectric material 9 that is present on the upper surface of the semiconductor body 6 may optionally be removed using a planarization or etching process.

Although not depicted in FIG. 3A, in a following etching process, the exposed portion of the gate dielectric material 9 that is present on the upper surface of the semiconductor body 6 and that is present in the second region 25 of the substrate 5 may be removed using an etch process selective to the remaining portion of the gate conductor material 10, the semiconductor body 6, and the dielectric layer 4 of the substrate 5.

FIGS. 3B and 3C depict another embodiment, in which following the removal of the gate conductor material 10 from the second region 25 of the substrate 5, the gate dielectric material 9 is then removed from the second region 25 of the substrate 5. In this embodiment, the subsequently formed semiconductor component of the resistive structure is present in direct contact with the dielectric layer 4, i.e., dielectric surface, which is overlying the second region 25 of the substrate 5.

Referring to FIG. 3B, prior to removing the portion of the gate conductor material 10 and the gate dielectric material 9 that is present in the second region 25 of the substrate 5, a spacer 12 may be formed abutting the portion of the gate conductor material 10 and gate dielectric material 9 that is present on the sidewall $S_1$ of the semiconductor body 6. The spacer 12 may be formed by depositing a conformal layer of amorphous silicon or polysilicon followed by etching. In one embodiment, the etching process is an anisotropic etching process, such as reactive ion etch. The spacer 12 may have a width $W_2$ ranging from 1 nm to 20 nm, typically ranging from 1 nm to 5 nm.

FIG. 3C depicts removing the gate conductor material 10 and the gate dielectric material 9 from the second region 25 of the substrate 5. The gate conductor material 10 may be removed using a selective etch process, in which the spacer 12 protects the portion of the gate conductor material 10 abutting the sidewall $S_1$ of the semiconductor body 6. The etch chemistry for removing the gate conductor material 10 may be selective to the spacer 12 and the gate dielectric material 9. In a following etch process, the exposed portion of the gate dielectric material 9, i.e., the portion of the gate dielectric material 9 that is not underlying the spacer 12, is then removed using a selective etching process. The etch chemistry for removing the gate dielectric material 9 may be selective to the spacer 12, the gate conductor material 10, and the substrate 5. The remaining portions of the gate conductor material 10 and the gate dielectric material 9 each include a base portion that laterally extends away from the sidewall $S_1$ of the semiconductor body 6. In one embodiment and following the etching of the gate dielectric material 9, the spacer 12 may be removed. It is noted that the removal of the spacer 12 is optional.

FIGS. 4A and 4B depict forming a semiconductor containing contact 14 in electrical communication with the gate conductor material 10 in the first region 20 of the substrate 5, and forming a semiconductor component 15 of a resistive structure overlying the dielectric surface, i.e., dielectric layer 4, in the second region 25 of the substrate 5. The semiconductor containing contact 14 is separated from the semiconductor component 15 of the resistive structure. The separation between the semiconductor containing contact 14 and the semiconductor component 15 defines the boundaries of the first region 20 and the second region 25 of the substrate 5. In one embodiment, in which the semiconductor containing contact 14 and the semiconductor component 15 of the resistive structure is composed of polysilicon, the polysilicon of the semiconductor contact 14 may be doped differently than the polysilicon of the semiconductor component 15. The polysilicon in the semiconductor component 15 of the resistive structure, i.e., eFuse or polysilicon resistor, and the polysilicon in the semiconductor contact 14 to gate metal may contain different types and/or amount of dopants. Different dopants in the semiconductor component 15 of the resistive structure, i.e., eFuse or polysilicon resistor, and the semiconductor containing contact 14 can be achieved by using the conventional patterning (e.g., lithography) and doping technique (e.g., implantation). In one example, the semiconductor component 15 of a polysilicon resistor may contain boron in a doping concentration ranging from $1\times10^{17}$ cm$^{-3}$ to $5\times10^{20}$ cm$^{-3}$. In one example, the semiconductor component 15 of an eFuse may be composed of polysilicon containing boron, arsenic, or phosphorus in a doping concentration ranging from $1\times10^{15}$ cm$^{-3}$ to $1\times10^{21}$ cm$^{-3}$. In one example, the semiconductor containing contact 14 may be polysilicon containing boron, arsenic, or phosphorus in a doping concentration ranging from $1\times10^{19}$ cm$^{-3}$ to $1\times10^{21}$ cm$^{-3}$.

In the embodiments depicted in FIGS. 4A and 4B, the semiconductor containing contact 14 may be composed of amorphous or polycrystalline silicon (polysilicon). The polysilicon may be undoped or doped with dopants, such as boron, arsenic, phosphorus, indium. In one embodiment, the semiconductor containing contact 14 may be doped with boron dopant in a concentration ranging from $1\times10^{18}$ cm$^{-3}$ to $1\times10^{21}$ cm$^{-3}$. The polysilicon can be in-situ doped (e.g., dopants are incorporated into the polysilicon during deposition) or ex-situ doped (e.g., dopants are incorporated into the polysilicon after deposition). The ex-situ doping can be achieved by ion implantation, plasma doping, gas phase doping, infusion doping, solid phase doping, etc. The semiconductor containing contact 14 may be composed of other semiconductor materials such as germanium, silicon germanium, and/or silicon carbide.

FIG. 4A depicts one embodiment of forming a semiconductor component 15 of a resistive structure, in which the semiconductor component 15 is in direct contact with the portion of the gate dielectric material 9 that is overlying the dielectric surface, i.e., dielectric layer 4, in the second region 25 of the substrate 5. FIG. 4B depicts another embodiment of forming a semiconductor component 15 of a resistive structure, in which the semiconductor component 15 is in direct contact with the dielectric surface, i.e., dielectric layer 4, in the second region 25 of the substrate 5.

Referring to FIGS. 4A and 4B, the semiconductor containing contact 14 and the semiconductor component 15 of the resistive structure are typically composed of doped polysilicon. To provide the semiconductor containing contact 14, a polysilicon layer is typically formed in electrical contact with the remaining gate conductor material 11 in the first region 20 of the substrate 5. In one embodiment, a polysilicon layer may be blanket deposited using chemical vapor deposition (CVD). Variations of CVD processes include, but are not limited to Atmospheric Pressure CVD (APCVD), Low Pressure CVD (LPCVD) and Plasma Enhanced CVD (PECVD), Metal-Organic CVD (MOCVD) and combinations thereof. The thickness of the polysilicon layer deposited at this point of the present invention may vary, but typically the deposited polysilicon layer has a thickness of from 5 nm to 100 nm, with a thickness of from 10 nm to 50 nm being more typical.

Following deposition of the polysilicon layer, the deposited polysilicon is doped with an appropriate dopant, or alternatively, an in-situ doping deposition process is employed in forming the polysilicon layer. The dopant may be an n-type or p-type dopant. The p-type dopant may include boron, aluminum, gallium, indium or a combination thereof. The semiconductor containing contact 14 may be doped by ion implantation. A typical implant dose is from $1 \times 10^{15}$ cm$^2$ to $5 \times 10^{16}$ cm$^2$. An optional block-mask can be used prior to implantation to pre-select the area in which the dopant is introduced.

In a following process sequence, to provide the semiconductor containing contact 14 the polysilicon layer is patterned to correspond to the first region 20 of the substrate 5 utilizing photolithography and etch process steps. In one embodiment, a pattern is produced by applying a photoresist to the surface to be etched, exposing the photoresist to a pattern of radiation, and then developing the pattern into the photoresist utilizing resist developer. Once the patterning of the photoresist is completed, the sections covered by the photoresist are protected, while the exposed regions are removed using a selective etching process that removes the unprotected regions.

Still referring to FIGS. 4A and 4B, the semiconductor component 15 of the resistive structure may also be composed of polysilicon. The polysilicon that provides the semiconductor component 15 of the resistive structure may be deposited using the same blanket deposition of polysilicon that provides the semiconductor containing contact 14 to the semiconductor device. In this embodiment, the semiconductor component 15 of the resistive structure is typically formed at the same time as the semiconductor containing contact 14. For example, a single polysilicon layer may be blanket deposited atop the structure depicted in FIG. 3A and FIG. 3C, in which the single polysilicon layer may then be patterned and etched to provide the semiconductor containing contact 14 and the semiconductor component 15. In one embodiment, the polysilicon layer is patterned and etched to provide a first portion corresponding to the first region 20 of the substrate 5 to provide the semiconductor containing contact 14, and a second portion corresponding to the second region 25 of the substrate 5 to provide the semiconductor component 15. Thereafter, ion implantation may implant the polysilicon of the semiconductor component 15 and the semiconductor containing contact 14.

Alternatively, the semiconductor component 15 may be formed using separate deposition, pattern and etching processes than the deposition, pattern and etching processes utilized to provide the semiconductor containing contact 14. Further, although the semiconductor component 15 and the semiconductor containing contact 14 are both typically composed of polysilicon, embodiments have been contemplated in which a different semiconducting material may be deposited for the semiconductor component 15 of the resistive structure and the semiconductor containing contact 14 of the semiconductor device. Other semiconductor materials that are suitable for the semiconductor containing contact 14 and the semiconductor component 15 include, but are not limited to, amorphous silicon, epitaxial silicon, single crystal silicon, silicon germanium alloy, silicon carbon alloy, silicon carbon germanium alloy, a III-IV compound semiconductor, or a II-VI compound semiconductor.

Referring to FIGS. 5A-5D, in one embodiment, in which the resistive structure 110 is a semiconductor containing fuse 111, such as an eFuse, the semiconductor component 15 may be composed of polysilicon that is homogeneously doped across the portions of the semiconductor component 15 that provide the cathode 19a, fuselink 19b, and anode 19c of the semiconductor containing fuse 111, as depicted in FIGS. 5A-5D. In one example, the homogeneously doped polysilicon that provides the semiconductor component 15 includes boron present in a concentration ranging from $1 \times 10^{18}$ cm$^{-3}$ to $4 \times 10^{20}$ cm$^{-3}$. In another embodiment, the cathode 19a, fuselink 19b, and anode portions 19c of the semiconductor containing fuse 111 may be doped with different dopants and dopant concentrations. In one example, the cathode 19a may be composed of undoped polysilicon, whereas the anode 19c and the fuselink 19b may be doped with a p-type dopant in a concentration of $5 \times 10^{19}$ atoms/cm$^2$ or greater, in some instances being greater than $3 \times 10^{20}$ atoms/cm$^2$. The anode 19c, fuselink 19b, and cathode 19c may be selectively doped via ion implantation in conjunction with a block-mask, e.g., photoresist mask, to pre-select the areas of the semiconductor component 15 in which the dopant is introduced.

In another embodiment, in which the semiconductor component 15 is subsequently processed to provide a semiconductor containing resistor 112, as depicted in FIGS. 5E-5H, the semiconductor component 15 may be composed of polysilicon that is doped or undoped. In one embodiment, the semiconductor containing resistor 112 may be doped with a boron dopant in a concentration ranging from $1 \times 10^{18}$ cm$^{-3}$ to $4 \times 10^{20}$ cm$^{-3}$.

FIGS. 5A-5H depict some examples of semiconductor devices 100 and resistive structures 110 that may be formed from the structures depicted in FIGS. 4A and 4B. For example, the semiconductor devices 100 may be finFETs, and the resistive structures 110 may be semiconductor containing fuses 111, as depicted in FIGS. 5A-5D, or semiconductor containing resistors 112, as depicted in FIGS. 5E-5H.

FIGS. 5A and 5B depict one embodiment of a device in which a semiconductor device 110, e.g. finFET, is present in the first region 20 of the substrate 5 and a semiconductor containing fuse 111, e.g., eFuse, is present in the second region 25 of the substrate 5. In this embodiment, the semiconductor component 15 of a semiconductor containing fuse 110a is in direct contact with the gate dielectric material 9 of the semiconductor device 100 that is overlying the dielectric surface, i.e., dielectric layer 4, in the second region 25 of the substrate 5.

In one embodiment, the semiconductor device 110 is present on the dielectric layer 4 in the first region 20 of the substrate 5, in which the semiconductor device 110 includes a semiconducting body 6 and a gate structure 26, the gate structure 26 including a gate dielectric material 9 present on the semiconducting body 6 and a gate conductor material 10 present on the gate dielectric material 9. The semiconductor containing fuse 111 is typically composed of a layered structure 27 including a conductive material 19 atop a semiconductor material, i.e., semiconductor component 15, the semiconductor containing fuse 111 comprising an anode 19c, a cathode 19a, and a fuselink 19b connecting the anode 19c and the cathode 19a.

FIGS. 5C and 5D depict another embodiment of the present invention, in which a semiconductor device 110, e.g., finFET, is present in the first region 20 of the substrate 5 and a semiconductor containing fuse 111, e.g., eFuse, is present in the second region 25 of the substrate 5, wherein the semiconductor component 15 of the semiconductor containing fuse 111 is in direct contact with the dielectric surface, i.e., dielectric layer 4, in the second region 25 of the substrate 5. The components of the semiconductor device 110 and the semiconductor containing fuse 111 described above with respect to FIGS. 5A and 5B are applicable to the embodiments of the invention consistent with FIGS. 5C and 5D.

FIGS. 5E and 5F depict one embodiment of a device in which a semiconductor device 100, e.g., finFET, is present in the first region 20 of the substrate 5 and a semiconductor containing resistor 112 is present in the second region 25 of the substrate 5. In this embodiment, the semiconductor component 15 of the semiconductor containing resistor, e.g., polysilicon resistor, is in direct contact with the gate dielectric material 9 of the semiconductor device 100 that is overlying the dielectric layer 4 in the second region 25 of the substrate 5.

Typically, the semiconductor device 100 present on the dielectric layer 4 in the first region 20 of the substrate 5 includes a semiconductor body 6 and a gate structure 26. The gate structure 26 includes a gate dielectric material 9 present on the semiconducting body 6, and a gate conductor material 10 present on the gate dielectric material 9. The semiconductor containing resistor 112 may include a semiconductor material, i.e., a semiconductor component 15, having a first terminal 21 and a second terminal 22 on an upper surface of the semiconductor material, in which a lower surface of the semiconductor material is in direct contact with the dielectric layer 4 that is present in the second region 25 of the substrate 5.

FIGS. 5G and 5H depict one embodiment of a device, in which a semiconductor device 100 is present in the first region 20 of the substrate 5 and a semiconductor containing resistor, e.g., polysilicon resistor, is present in the second region 25 of the substrate 5, in which the semiconductor component 15 of the semiconductor containing resistor 112, is in direct contact with the dielectric surface, i.e., dielectric layer 4, in the second region 25 of the substrate 5. The components of the semiconductor device 100 and the semiconductor containing resistor 112 described above with respect to FIGS. 5E and 5F are applicable to the embodiments of the invention consistent with FIGS. 5G and 5H.

In each of the embodiments depicted in FIGS. 5A-5H, following the formation of the semiconductor containing contact 14, the semiconductor body 6 is doped to provide the source region 16 and drain region 17 of the semiconductor device 100. For example, dopants may be implanted via ion implantation into each end of the semiconductor body 6 to produce n-type conductivity or p-type conductivity dopant regions, i.e., source regions 16 and drain regions 17. P-type conductivity dopant regions are produced in the Si-containing semiconductor body 6 by doping each end of the semiconductor body 6 with group III-A elements of the Periodic Table of Elements, such as boron (B). N-type conductivity dopant regions are produced in the Si-containing semiconductor body 6 by doping each end of the semiconductor body 6 with group V elements, such as phosphorus (P) or arsenic (As).

Following the formation of the source region 16 and drain region 17 of the semiconductor device 100, conductive structures are formed to the semiconductor containing contact 14 to the semiconductor device 100 and the semiconductor component 15 of the resistive structure 110, e.g., semiconductor containing fuse 111 or semiconductor containing resistor 112. The conductive structures may be composed of a conductive material, such as a metal, a metal nitride, a metal semiconductor alloy, or a combination thereof. In some examples the conductive material of the conductive structures may be nickel silicide, nickel platinum silicide, cobalt silicide, tantalum silicide, titanium silicide, Ta, Ti, W, Cu, Al, Ni, Ag, Au, tantalum nitride, titanium nitride, tungsten nitride or alloys and combinations thereof.

In one example, the conductive structure (also referred to as conductive material) that is formed on the semiconductor containing contact 14 to the semiconductor device 100, and the semiconductor component 15 of the resistive structure 110, e.g., semiconductor containing fuse 111 or semiconductor containing resistor 112, is a metal semiconductor alloy. Typically, the metal semiconductor alloy is a silicide. Silicide formation typically requires depositing a refractory metal, such as Ni or Ti, onto the surface of a Si-containing material, such as polysilicon. Following deposition, the structure is then subjected to an annealing step using conventional processes such as, but not limited to, rapid thermal annealing. During thermal annealing, the deposited metal reacts with silicon forming a metal silicide. Examples of silicides suitable for the conductive structure, i.e., conductive material, to the semiconductor devices 100 and the resistive structure 110 include, but are not limited to, nickel silicide ($NiSi_x$), nickel platinum silicide ($NiPt_ySi_x$), cobalt silicide ($CoSi_x$), tantalum silicide ($TaSi_x$), and titanium silicide ($TiSi_x$). The conductive structures to the semiconductor containing contact 14 of the semiconductor device 100 and the semiconductor component 15 of the resistive structure 110 may be formed simultaneously using the same deposition and annealing process steps, or may be formed separately using separate deposition and annealing process steps.

In each of the embodiments depicted in FIGS. 5A-5H, a semiconductor contact silicide 18 may be formed on the semiconductor containing contact 14 to the semiconductor device 100. The thickness of the semiconductor contact silicide 18 may range from 1 nm to 5 nm, and typically ranges from 2 nm to 3 nm. The semiconductor contact silicide 18 may extend the upper surface of the semiconductor containing contact 14 in its entirety or may be present on only a portion of the semiconductor containing contact 14.

Referring to FIGS. 5A-5D, in the embodiments of the invention in which the resistive structure 110 is a semiconductor containing fuse 111, e.g., an eFuse, the conductive structure (also referred to as a conductive material) may be a fuse contact silicide 19 that extends across the upper surface of the semiconductor component 15. The fuse contact silicide 19 typically includes cathode 19a, fuselink 19b, and anode 19c portions, in which the fuselink 19b portion of the fuse contact silicide 19 typically has a lesser width than the cathode 19a and anode 19c portions of the fuse contact silicide 19. In one embodiment, the fuselink 19b typically has a width $W_2$ ranging from 1 nm to 20 nm, typically ranging from 2 nm to 5 nm. The cathode 19a may have a width $W_3$ ranging from 10 nm to 50 nm, typically ranging from 20 nm to 20 nm. The anode 19c may have a width $W_4$ ranging from 10 nm to 50 nm, typically ranging from 20 nm to 20 nm. The thickness of the fuse contact silicide 19 may range from 1 nm to 5 nm, and typically ranges from 2 nm to 3 nm.

It is noted that the above dimensions for the cathode 19a, fuselink 19b, and anode 19c portions of the fuse contact silicide 19 have been provided for illustrative purposes only, and are not intended to limit the invention solely thereto. Similarly, the present invention is not limited to the specific material compositions for fuse contact silicide 19. Other dimensions and conductive materials for the cathode 19a, fuselink 19b, and anode 19c portions of the conductive structure to the semiconductor component 15 of the semiconductor containing fuse 111 have been contemplated and are within the scope of the present invention. The material and dimensions for the cathode 19a, anode 19c and fuselink 19b are selected to provide for electro-migration of the fuselink 19b when the semiconductor containing fuse 111 is subjected to a logic event or laser that blows the fuse. Specifically, application of the logic event or laser causes electro-migration of the conductive material, e.g., silicide, of the fuselink providing for an open condition between the anode 19c and the cathode 19b. It is noted that in an eFuse application, the electro-migration of the fuselink 19b is reversible. The geometry of the cathode 19a, fuselink 19b, and anode 19c portions of the conductive structure to the semiconductor component 15 of the semiconductor containing fuse 111 may be provided using deposition, photolithography, and selective etching processes.

eFuses may be used in the semiconductor industry to implement array redundancy, field programmable arrays, analog component trimming circuits, and chip identification circuits. Once programmed, the programmed state of an eFuse does not revert to the original state on its own, that is, the programmed state of the fuse is not reversible. For this reason, eFuses are called One-Time-Programmable (OTP) memory elements.

The mechanism for programming an eFuse is electromigration of a metal semiconductor alloy, e.g., silicide, induced by an applied electrical field and an elevated temperature on a portion of the eFuse structure. The metal semiconductor alloy is electromigrated under these conditions from the portion of the eFuse structure, thereby increasing the resistance of the eFuse structure. The rate and extent of electromigration during programming of an eFuse is dependent on the temperature and the current density at the electromigrated portion.

An eFuse typically comprises an anode, a cathode, and a fuselink. The fuselink is a narrow strip of a conductive material adjoining the anode and cathode. During programming of the electrical fuse, a positive voltage bias is applied to the anode and a negative voltage bias is applied to the cathode. As electrical current flows through the fuselink having a narrow cross-sectional area, the temperature of the fuselink is elevated. A high current density combined with the elevated temperature at the fuselink facilitates electromigration of the conductive material, which may comprise a metal silicide.

Referring to FIGS. 5E-5G, in the embodiments of the invention in which the resistive structure 110 is a semiconductor containing resistor 112, the conductive structure to the semiconductor component 15 of the semiconductor containing resistor 112 may include a first terminal 21 and a second terminal 22 present on the upper surface of the semiconductor component 15. In one embodiment, the first terminal 21 and the second terminal 22 are physically separated from one another, and are typically at opposing ends of the semiconductor component. The first terminal 21 and the second terminal 22 are typically composed of the same conductive material, but embodiments have been contemplated in which the conductive material of the first terminal is compositionally different from the second terminal 22. The first terminal 21 and the second terminal 22 may be provided using deposition, photolithography, and selective etching processes. The thickness of the conductive material, e.g., silicide, that provides the first terminal 21 and the second terminal 22 may range from 1 nm to 5 nm, and typically ranges from 2 nm to 3 nm.

Referring to FIGS. 5A-5H, in one embodiment, following the formation of the conductive structures to the semiconductor containing contact 14 of the semiconductor device 100, and to the semiconductor component 15 of the resistive structure 110, back end of the line (BEOL) processing may be conducted to provide an interlevel dielectric layer 50 and at least one interconnect 51 providing electrical communication to the semiconductor device 100 and the resistive structure 110. In one example, a layer of dielectric material 50 is blanket deposited atop the entire substrate 5 and planarized. The blanket interlevel dielectric layer 50 may be selected from the group consisting of silicon-containing materials such as $SiO_2$, $Si_3N_4$, SiON, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H). Additional choices for the blanket dielectric include: any of the aforementioned materials in porous form, or in a form that changes during processing to or from being porous and/or permeable to being non-porous and/or non-permeable.

The blanket interlevel dielectric layer 50 may be formed by deposition methods, including, but not limited to: spinning from solution, spraying from solution, chemical vapor deposition (CVD), plasma enhanced CVD (PECVD), sputter deposition, reactive sputter deposition, ion-beam deposition, and evaporation.

The blanket interlevel dielectric layer 50 is then patterned and etched to forth via holes to the conductive structures of the semiconductor device 100, such as the semiconductor contact silicide 18, and the conductive structures of the resistive structure 110, such as the cathode 19a, and anode 19c portions of the conductive structure to the semiconductor component 15 of the semiconductor containing fuse 111 (as depicted in FIGS. 5A-5D), and/or the first terminal 21 and second terminal 22 of the semiconductor component 15 of the semiconductor containing resistor 112 (as depicted in FIGS. 5E-5H).

Following via formation interconnects 51 are formed by depositing a conductive metal into the via holes using conventional processing, such as CVD or plating. The conductive metal may include, but is not limited to: tungsten, copper, aluminum, silver, gold, and alloys thereof.

Although only one finFET transistor is shown, the structure may comprise multiple finFET transistors that may be identical or different (e.g., one finFET may be n-type FET and the other may be p-type FET). Also, the structure may comprise finFET, resistor, and eFuse on the same chip.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A device comprising:
   a substrate comprising a first region and a second region in which a dielectric layer is present on the substrate;
   a semiconductor device present on the dielectric layer in the first region of the substrate, the semiconductor device comprising a semiconducting body and a gate structure, the gate structure including a gate dielectric material present on the semiconducting body and a gate conductor material present on the gate dielectric material; and
   a semiconductor containing fuse comprised of a layered structure including a conductive material atop a semiconductor material, the semiconductor containing fuse comprising an anode, a cathode, and a fuselink connecting the anode and the cathode, wherein the semiconductor material of the semiconductor containing fuse is in direct contact with the dielectric layer in the second region of the substrate.

2. The device of claim 1, wherein the gate dielectric material of the semiconductor device is not present between the semiconductor material of the semiconductor containing fuse and the dielectric layer in the second region of the substrate.

3. The device of claim 1, wherein the semiconductor device is a finFET and the semiconductor containing fuse is an eFuse.

4. The device of claim 1, wherein the semiconductor material of the semiconductor containing fuse comprises polysilicon, amorphous silicon, epitaxial silicon, single crystal silicon, silicon germanium alloy, silicon carbon alloy, silicon carbon germanium alloy, a III-IV compound semiconductor, a II-VI compound semiconductor or a combination thereof.

5. The device of claim 1, wherein the conductive material of the semiconductor containing fuse comprises a metal, a metal nitride, a metal semiconductor alloy, or a combination thereof.

6. The device of claim 1, wherein the conductive material of the semiconductor containing fuse comprises nickel silicide, nickel platinum silicide, cobalt silicide, tantalum silicide, titanium silicide, Ta, Ti, W, Cu, Al, Ni, Ag, Au, tantalum nitride, titanium nitride, tungsten nitride or a combination thereof.

7. The device of claim 1, wherein the gate conductor material of the semiconductor device in the first region of the substrate is not present between the semiconductor layer of the semiconductor containing fuse and the dielectric layer in the second region of the substrate.

8. The device of claim 1, wherein the gate dielectric material comprises $SiO_2$, $HfO_2$, $ZrO_2$, $Al_2O_3$, $TiO_2$, $La_2O_3$, $SrTiO_3$, $LaAlO_3$, $Y_2O_3$ or a combination thereof.

9. The device of claim 1, wherein the gate dielectric material is a high-k dielectric.

10. The device of claim 1, wherein the gate conductor material comprises Ti, Zr, Hf, V, Nb, Ta, TiN, TaN or a combination thereof.

11. A device comprising:
a substrate comprising a first region and a second region, wherein a dielectric layer is present on the substrate;
a semiconductor device present on the dielectric layer in the first region of the substrate, the semiconductor device comprising a semiconductor body and a gate structure, the gate structure including a gate dielectric material present on the semiconducting body and a gate conductor material present on the gate dielectric material, wherein the gate dielectric material extends into the second region of the substrate; and
a semiconductor containing fuse comprised of a layered structure including a conductive material atop a semiconductor material, in which the layered structure includes an anode, a cathode, and a fuselink connecting the anode and the cathode, in which the gate dielectric material of the semiconductor device is present between and in direct contact with the semiconductor layer of the semiconductor containing fuse and the dielectric layer in the second region of the substrate.

12. A device comprising:
a substrate comprising a first region and a second region, wherein a dielectric layer is present on the substrate;
a semiconductor device present on the dielectric layer in the first region of the substrate, the semiconductor device comprising a semiconductor body and a gate structure, the gate structure including a gate dielectric material present on the semiconducting body and a gate conductor material present on the gate dielectric material; and
a semiconductor containing resistor comprised of a semiconductor material having a first terminal and a second terminal on an upper surface of the semiconductor material, the first terminal being separated from the second terminal so that the upper surface of the semiconductor material is exposed between the first terminal and the second terminal and so that current passing from the first terminal to the second terminal must pass through the semiconductor material that the first terminal and the second terminal is present on, wherein a lower surface of the semiconductor material of the resistive structure is in direct contact with the dielectric layer in the second region of the substrate.

13. The device of claim 12, wherein the gate conductor material of the semiconductor device in the first region of the substrate is not present between the semiconductor layer of the resistive structure and the dielectric layer in the second region of the substrate.

14. The device of claim 12, wherein the gate dielectric material is a high-k dielectric.

15. The device of claim 12, wherein the gate conductor material comprises Ti, Zr, Hf, V, Nb, Ta, TiN, TaN or a combination thereof.

16. A device comprising:
a substrate comprising a first region and a second region, wherein a dielectric layer is present on the substrate;
a semiconductor device present on the dielectric layer in the first region of the substrate, the semiconductor device comprising a semiconductor body and a gate structure, the gate structure including a gate dielectric material present on the semiconducting body and a gate conductor material present on the gate dielectric material, wherein the gate dielectric material of the semiconductor device extends into the second region of the substrate; and
a resistive structure comprised of a semiconductor material having a first terminal and a second terminal on an upper surface of the semiconductor material, wherein a lower surface of
the semiconductor material is in direct contact with the gate dielectric material of the semiconductor device that is present between and in direct contact with the semiconductor layer of the resistive structure and the dielectric layer in the second region of the substrate.

17. A method of forming a device comprising:
providing a substrate having a first region and second region, wherein the substrate comprises a dielectric surface;
forming a semiconductor body on the dielectric surface overlying the first region of the substrate;
forming a gate stack on the semiconductor body and overlying the dielectric surface in the first region and the second region of the substrate, wherein the gate stack includes a gate dielectric material in contact with at least the semiconductor body and the gate dielectric material is present on the dielectric surface of the second region of the substrate, and a gate conductor material on the gate dielectric material;
removing at least the gate conductor material from the gate stack in the second region of the substrate;
forming a semiconductor containing contact in electrical communication with the gate conductor material and a semiconductor component of a resistive structure in direct contact with the gate dielectric material that is overlying the dielectric surface of the second region of the substrate, wherein the semiconductor containing contact is separated from the semiconductor component of the resistive structure;
forming source and drain regions in the semiconductor body; and
forming a conductive structure to the semiconductor component of the resistive structure.

18. The method of claim 17, further comprising removing the gate dielectric material from the second region of the substrate, wherein the semiconductor component of the resistive structure is present in direct contact with the dielectric surface of the second region.

19. The method of claim 17, wherein the semiconductor body is configured to provide a finFET.

20. The method of claim 17, wherein the resistive structure is a polysilicon resistor, and the forming of the conductive structure to the semiconductor component comprises:
   forming a first terminal on a first upper surface of the semiconductor component and a second terminal on a second upper surface of the semiconductor component; and
   forming a first interconnect to the first terminal and a second interconnect to the second terminal.

21. The method of claim 17, wherein the resistive structure is a semiconductor containing fuse, and the forming of the conductive structure to the semiconductor component comprises:
   forming a silicide layer over the semiconductor component, the silicide layer including a cathode, an anode, and a fuselink connecting the cathode to the anode; and
   forming a first interconnect to the anode and a second interconnect to the cathode.

* * * * *